US010692958B2

(12) United States Patent
Lee et al.

(10) Patent No.: US 10,692,958 B2
(45) Date of Patent: Jun. 23, 2020

(54) ORGANIC LIGHT EMITTING DIODE DISPLAY

(71) Applicant: LG Display Co., Ltd., Seoul (KR)

(72) Inventors: Joonsuk Lee, Paju-si (KR); Sejune Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/211,748

(22) Filed: Dec. 6, 2018

(65) Prior Publication Data

US 2019/0172893 A1 Jun. 6, 2019

(30) Foreign Application Priority Data

Dec. 6, 2017 (KR) .......................... 10-2017-0167048

(51) Int. Cl.
| | |
|---|---|
| *H01L 27/32* | (2006.01) |
| *H01L 51/52* | (2006.01) |
| *H01L 51/00* | (2006.01) |
| *H01L 51/50* | (2006.01) |
| *G09G 3/3233* | (2016.01) |

(52) U.S. Cl.
CPC ........ *H01L 27/3276* (2013.01); *H01L 27/322* (2013.01); *H01L 27/3246* (2013.01); *H01L 27/3253* (2013.01); *H01L 51/5012* (2013.01); *H01L 51/525* (2013.01); *H01L 51/5246* (2013.01); *H01L 51/5256* (2013.01); *G09G 3/3233* (2013.01); *G09G 2310/08* (2013.01); *H01L 27/3209* (2013.01); *H01L 27/3225* (2013.01); *H01L 27/3251* (2013.01); *H01L 51/0024* (2013.01)

(58) Field of Classification Search
CPC ............. H01L 51/5012; H01L 51/5246; H01L 51/525; H01L 51/5256; H01L 51/0024; H01L 27/3246; H01L 27/3276; H01L 27/3253; H01L 27/322; H01L 27/3283; H01L 27/3295; H01L 27/3297; H01L 27/3209; H01L 27/3225; G09G 3/3291; G09G 3/3233; G09G 3/3208
See application file for complete search history.

(56) References Cited

U.S. PATENT DOCUMENTS

2014/0183502 A1* 7/2014 Song .................. H01L 27/3246
257/40
2016/0349899 A1* 12/2016 Hwang ................ G06F 3/0416
(Continued)

*Primary Examiner* — Mohsen Ahmadi
(74) *Attorney, Agent, or Firm* — Morgan, Lewis & Bockius LLP

(57) ABSTRACT

An organic light emitting diode display is disclosed. The organic light emitting diode display includes a first substrate and a second substrate facing each other, and a conductive filler layer between the first and second substrates. The first substrate includes a bank layer having an opening exposing at least a portion of an anode, a spacer on the bank layer, an organic compound layer and a cathode disposed on the anode, the bank layer, and the spacer, an inorganic layer disposed on the cathode and including a first open hole exposing at least a portion of the cathode on the spacer, and an organic layer disposed on the inorganic layer and including a second open hole exposing at least a portion of the cathode on the spacer. The second substrate includes a power line electrically connected to a portion of the exposed cathode through the conductive filler layer.

16 Claims, 10 Drawing Sheets

(56) References Cited

U.S. PATENT DOCUMENTS

| | | | |
|---|---|---|---|
| 2016/0351636 A1* | 12/2016 | Lee | H01L 27/3276 |
| 2016/0351638 A1* | 12/2016 | Im | H01L 27/3246 |
| 2016/0351846 A1* | 12/2016 | Kim | H01L 51/5212 |
| 2017/0047386 A1* | 2/2017 | Lee | H01L 27/3246 |
| 2017/0133620 A1* | 5/2017 | Lee | H01L 51/5212 |
| 2017/0170431 A1* | 6/2017 | Im | H01L 27/3262 |
| 2017/0179208 A1* | 6/2017 | Jang | H01L 27/3246 |
| 2018/0006106 A1* | 1/2018 | Oh | H01L 27/322 |

\* cited by examiner

ORGANIC LIGHT EMITTING DIODE DISPLAY

This application claims the priority benefit of Korean Patent Application No. 10-2017-0167048 filed on Dec. 6, 2017, which is incorporated herein by reference for all purposes as if fully set forth herein.

BACKGROUND

Technical Field

The present disclosure relates to an organic light emitting diode display.

Discussion of the Related Art

Various display devices have replaced heavier and larger cathode ray tubes (CRTs). Examples of the display devices may include a liquid crystal display (LCD), a field emission display (FED), a plasma display panel (PDP), and an organic light emitting diode (OLED) display.

In more detail, an OLED display is a self-emission display configured to emit light by exciting an organic compound. The OLED display does not require a backlight unit used in a liquid crystal display and thus has advantages of a thin profile, lightness in weight, and a simpler manufacturing process. The OLED display can be also manufactured at a low temperature and has a fast response time of 1 ms or less, low power consumption, a wide viewing angle, and a high contrast. Thus, the OLED display has been widely used.

The OLED display includes organic light emitting diodes (OLEDs) converting electric energy into light energy. The OLED includes an anode, a cathode, and an organic compound layer between the anode and the cathode. The OLED display is configured such that the OLED emits light while excitons formed by combining holes from the anode and electrons from the cathode inside an emission layer fall from an excited state to a ground state, and thus displays an image.

However, a large-area OLED display cannot maintain a uniform luminance throughout an entire surface of an active area, on which an input image is displayed, and generates a luminance variation (or luminance deviation) depending on a position. More specifically, a cathode constituting an organic light emitting diode is formed to cover most of the active area, and there is a problem that a power voltage applied to the cathode does not have a constant voltage value throughout the entire surface of the active area. For example, as a difference between a voltage value at an entrance of the cathode supplied with the power voltage and a voltage value at a position apart from the entrance increases due to a resistance of the cathode, the luminance variation depending on the position increases.

The problem is more problematic in a top emission type display device. Namely, in the top emission type display device, because it is necessary to secure a transmittance of a cathode positioned at an upper layer of an organic light emitting diode, the cathode is formed of a transparent conductive material such as indium tin oxide (ITO), or an opaque conductive material with a very small thickness. In this instance, because a surface resistance of the cathode increases, a luminance variation depending on a position remarkably increases corresponding to an increase in the surface resistance.

In order to solve such a problem, a method was proposed to prevent a voltage drop depending on a position by forming a low potential power voltage line including a low resistance material and connecting the low potential power voltage line to a cathode. In the proposed method according to a related art, because the low potential power voltage line was formed on a lower substrate including transistors, one pixel has to further include a connection area of the low potential power voltage line and the cathode in addition to a thin film transistor area and a storage capacitor area. Thus, it was difficult to apply the related art to a high-resolution display including small-sized unit pixels.

Further, because a connection structure of the low potential power voltage line and the cathode according to the related art was complicated and required an additional process forming a barrier, there was a problem that the manufacturing cost and manufacturing time increased and the manufacturing yield was reduced.

SUMMARY

Accordingly, embodiments of the present disclosure are directed to an organic light emitting diode device that substantially obviates one or more of the problems due to limitations and disadvantages of the related art.

An aspect of the present disclosure is to provide an organic light emitting diode display capable of achieving a uniform luminance by minimizing a variation in a low potential power voltage depending on a position.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an organic light emitting diode display comprises a first substrate and a second substrate facing each other, and a conductive filler layer interposed between the first substrate and the second substrate, wherein the first substrate includes a bank layer having an opening exposing at least a portion of an anode, a spacer disposed on the bank layer, an organic compound layer and a cathode disposed on the anode, the bank layer, and the spacer, the organic compound layer and the cathode being sequentially stacked, an inorganic layer disposed on the cathode, the inorganic layer including a first open hole exposing at least a portion of the cathode positioned on the spacer, and an organic layer disposed on the inorganic layer, the organic layer including a second open hole exposing at least a portion of the cathode positioned on the spacer, wherein the second substrate includes a power line electrically connected to a portion of the exposed cathode through the conductive filler layer.

The second open hole may expose at least a portion of the inorganic layer and the first open hole.

A planar shape of the first open hole may correspond to a planar shape of the spacer.

A planar shape of the second open hole may correspond to a planar shape of the spacer.

An upper surface of the organic layer may be positioned on the same plane as an upper surface of the exposed cathode, or may be positioned below the upper surface of the exposed cathode.

An upper surface of the inorganic layer may be positioned on the same plane as an upper surface of the exposed cathode, or may be positioned below the upper surface of the exposed cathode.

An upper surface of the organic layer may be positioned on the same plane as an upper surface of the inorganic layer.

The exposed portion of the cathode may directly contact the conductive filler layer.

The first substrate may include a power electrode receiving a power voltage from a power generating part. The power electrode may directly contact the conductive filler layer.

The first substrate may include a power electrode receiving a power voltage from a power generating part. The cathode may directly contact the power electrode.

The first substrate may include a protruding pattern protruding toward the second substrate. The cathode may be extended to cover at least a portion of the protruding pattern.

The protruding pattern may be configured as a single layer including a material constituting the bank layer or a material constituting the spacer, or may be configured as a plurality of layers provided by stacking the material constituting the bank layer and the material constituting the spacer.

The inorganic layer may include a third open hole exposing at least a portion of the cathode positioned on the protruding pattern, and the organic layer includes a fourth open hole exposing at least a portion of the cathode positioned on the protruding pattern.

The fourth open hole may expose at least a portion of the inorganic layer and the third open hole.

The second substrate may further include color filters, and the color filters are partitioned by the power line.

Each of the first substrate and the second substrate may include an emission region, to which light from an organic light emitting diode is emitted, and a non-emission region outside the emission region. The power line may be disposed in the non-emission region.

The second substrate may further include an auxiliary power line, of which one surface directly contacts the power line and another surface opposite the one surface directly contacts the conductive filler layer. The auxiliary power line may have an area larger than the power line.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles.

DETAILED DESCRIPTION

Reference will now be made in detail to embodiments of the disclosure, examples of which are illustrated in the accompanying drawings. Wherever possible, the same reference numbers will be used throughout the drawings to refer to the same or like parts. Detailed descriptions of known arts will be omitted if such may mislead the embodiments of the disclosure. In describing various embodiments, the same components may be described in a first embodiment, and a description thereof may be omitted in other embodiments.

The terms "first", "second", etc. may be used to describe various components, but the components are not limited by such terms. The terms are used only for the purpose of distinguishing one component from other components.

Figure 1:
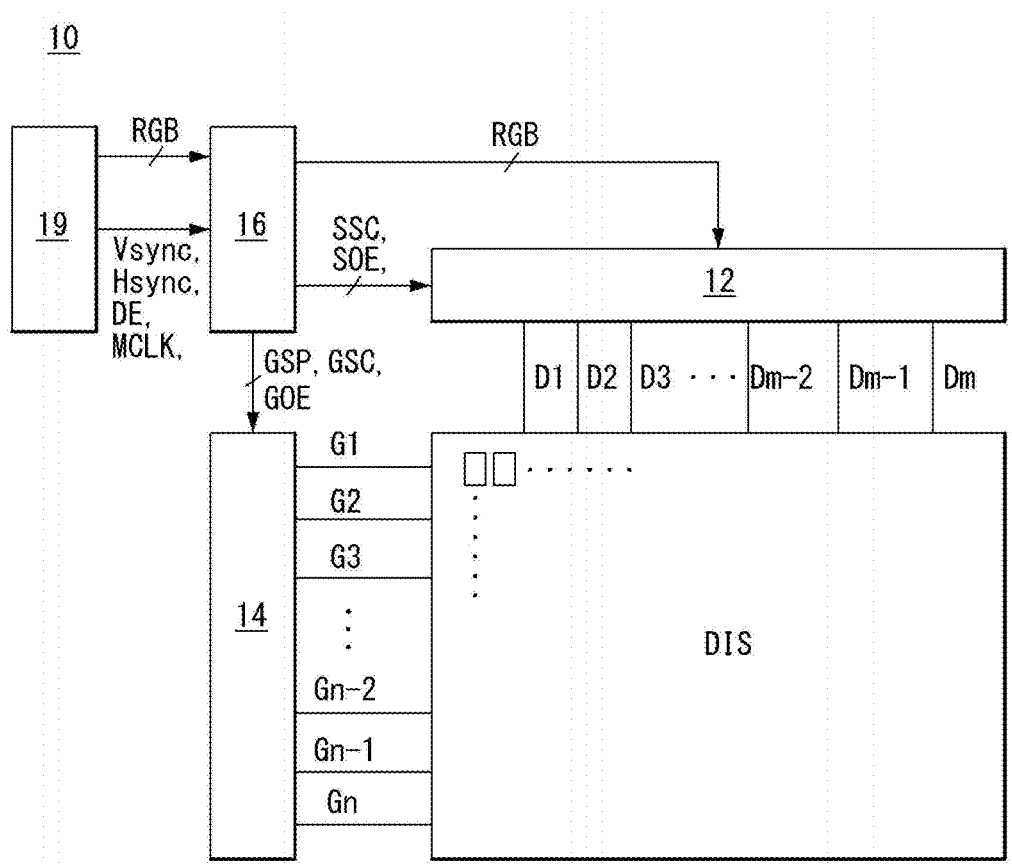
FIG. 1 is a block diagram schematically illustrating an organic light emitting diode (OLED) display according to an embodiment of the disclosure.
Figure 2:
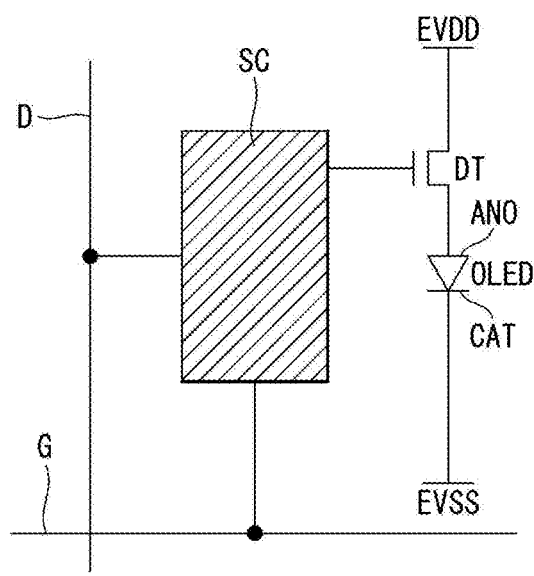
FIG. 2 schematically illustrates configuration of a pixel shown in FIG. 1.

FIG. 1 is a block diagram schematically illustrating an organic light emitting diode (OLED) display according to an embodiment of the disclosure. FIG. 2 schematically illustrates configuration of a pixel shown in FIG. 1.

Referring to FIG. 1, an OLED display 10 according to an embodiment of the disclosure includes a display driving circuit and a display panel DIS.

The display driving circuit includes a data driving circuit 12, a gate driving circuit 14, and a timing controller 16. The display driving circuit applies a video data voltage of an input image to pixels of the display panel DIS. The data driving circuit 12 converts digital video data RGB received from the timing controller 16 into an analog gamma compensation voltage and generates a data voltage. The data voltage output from the data driving circuit 12 is supplied to data lines D1 to Dm, where m is a positive integer. The gate driving circuit 14 sequentially supplies a gate signal synchronized with the data voltage to gate lines G1 to Gn and selects pixels of the display panel DIS to which the data voltage is applied, where n is a positive integer.

The timing controller 16 receives timing signals, such as a vertical sync signal Vsync, a horizontal sync signal Hsync, a data enable signal DE, and a main clock MCLK, from a host system 19 and synchronizes operation timing of the data driving circuit 12 with operation timing of the gate driving circuit 14. A data timing control signal for controlling the data driving circuit 12 includes a source sampling clock SSC, a source output enable signal SOE, and the like. A gate timing control signal for controlling the gate driving circuit 14 includes a gate start pulse GSP, a gate shift clock GSC, a gate output enable signal GOE, and the like.

The host system 19 may be one of a television system, a set-top box, a navigation system, a DVD player, a Blu-ray player, a personal computer (PC), a home theater system, a phone system, and other systems that include or operate in conjunction with a display. The host system 19 includes a system-on chip (SoC), in which a scaler is embedded, and converts the digital video data RGB of the input image into a format suitable for displaying the input image on the display panel DIS. The host system 19 transmits the digital video data RGB of the input image and the timing signals Vsync, Hsync, DE and MCLK to the timing controller 16.

The display panel DIS includes a pixel array. The pixel array includes the pixels defined by the data lines D1 to Dm and the gate lines G1 to Gn. Each pixel includes an organic light emitting diode serving as a self-emission element.

Referring to FIG. 2, the display panel DIS includes a plurality of data lines D, a plurality of gate lines G intersecting the data lines D, and pixels respectively arranged at intersections of the data lines D and the gate lines G in a matrix. Each pixel includes an organic light emitting diode, a driving thin film transistor (TFT) DT for controlling an amount of current flowing through the organic light emitting diode, and a programming unit SC for setting a gate-to-source voltage of the driving thin film transistor DT.

The programming unit SC may include at least one switching thin film transistor and at least one storage capacitor. The switching thin film transistor is turned on in response to a gate signal from the gate line G to thereby apply a data voltage from the data line D to one electrode of the storage capacitor. The driving thin film transistor DT controls an amount of current supplied to the organic light emitting diode depending on a magnitude of voltage stored in the storage capacitor, thereby controlling an amount of light emitted by the organic light emitting diode. The amount of light emitted by the organic light emitting diode is proportional to the amount of current supplied from the driving thin film transistor DT. The pixel is connected to a high potential power voltage source and a low potential power voltage source and receives a high potential power voltage EVDD and a low potential power voltage EVSS from a power generating part (not shown). The thin film transistors constituting the pixel may be p-type thin film transistors or n-type thin film transistors. Further, semiconductor layers of the thin film transistors constituting the pixel may include amorphous silicon, polycrystalline silicon, or oxide. In the following description, embodiments of the disclosure use a semiconductor layer including oxide as an example. The organic light emitting diode includes an anode ANO, a cathode CAT, and an organic compound layer between the anode ANO and the cathode CAT. The anode ANO is connected to the driving thin film transistor DT.

Figure 3:
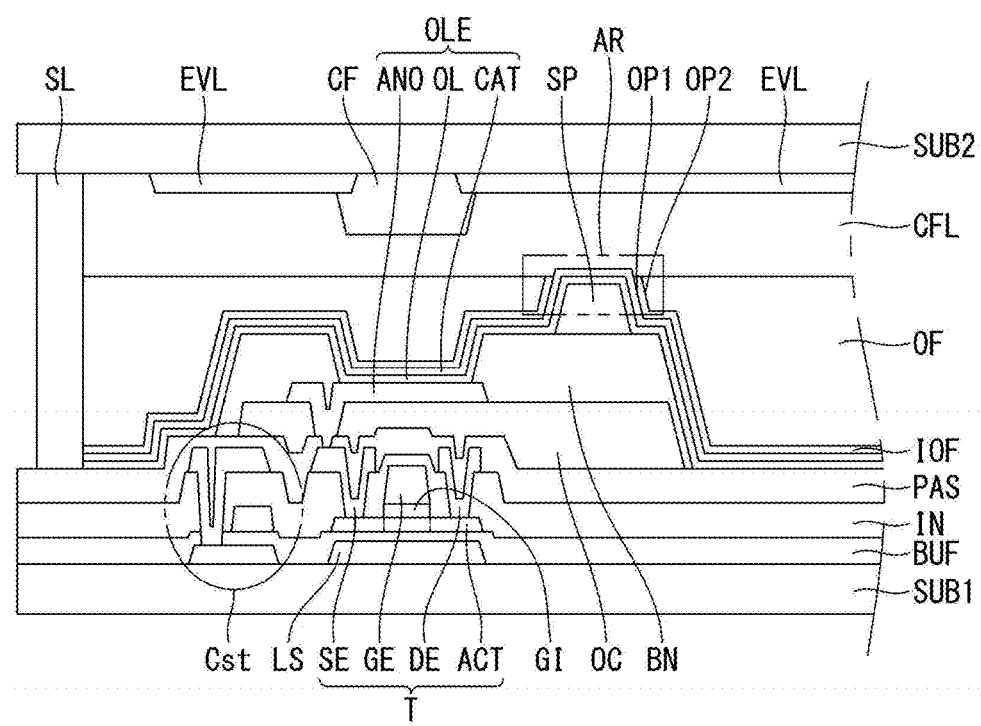
FIG. 3 is a cross-sectional view of an OLED display according to an embodiment of the disclosure.
Figure 4:
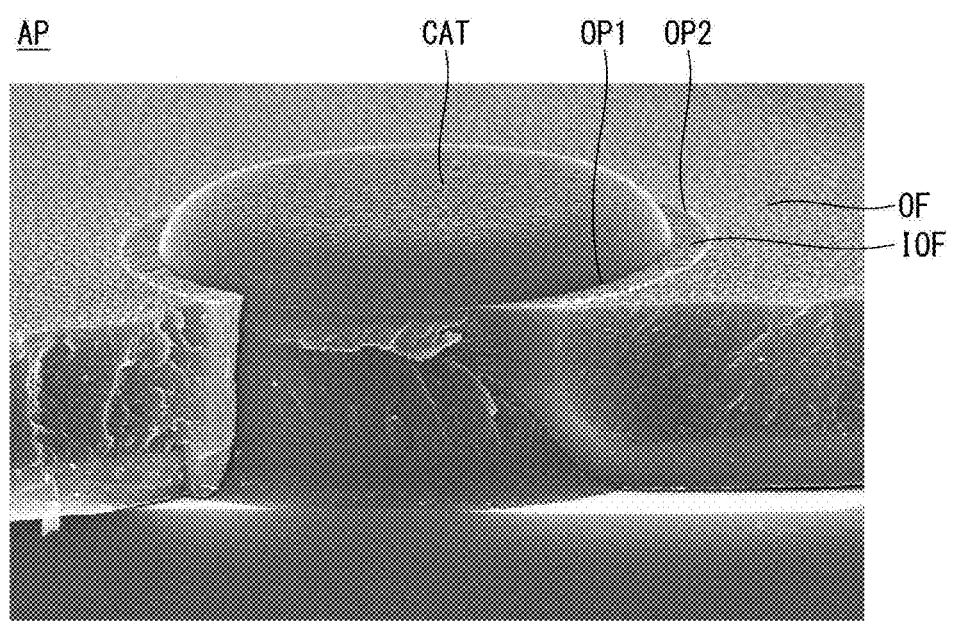
FIG. 4 is an enlarged view illustrating a real shape of an area AR shown in FIG. 3.

FIG. 3 is a cross-sectional view of an OLED display according to an embodiment of the disclosure. FIG. 4 is an enlarged view illustrating a real shape of an area AR shown in FIG. 3.

Referring to FIGS. 3 and 4, an OLED display according to an embodiment of the disclosure includes a display panel including a first substrate SUB1 and a second substrate SUB2 facing each other and a conductive filler layer CFL between the first substrate SUB1 and the second substrate SUB2. The first substrate SUB1 is a thin film transistor array substrate on which a thin film transistor T and an organic light emitting diode OLE are disposed. The second substrate SUB2 is a substrate on which a low potential power voltage line (hereinafter referred to as "Evss line") EVL is disposed. The second substrate SUB2 may function as an encapsulation substrate. The first substrate SUB1 and the second substrate SUB2 may be attached to each other using a sealant SL. The sealant SL is disposed at an edge of the first substrate SUB1 and an edge of the second substrate SUB2 and maintains a predetermined attachment distance between the first substrate SUB1 and the second substrate SUB2. The conductive filler layer CFL may be disposed inside the sealant SL.

The first substrate SUB1 may be made of glass material or plastic material. For example, the first substrate SUB1 may be made of plastic material such as polyimide (PI), polyethylene terephthalate (PET), polyethylene naphthalate (PEN), and polycarbonate (PC) and may have flexible characteristics.

The thin film transistor T and the organic light emitting diode OLE connected to the thin film transistor T are formed on the first substrate SUB1. A light shielding layer LS and a buffer layer BUF may be formed between the first substrate SUB1 and the thin film transistor T. The light shielding layer LS is disposed to overlap a semiconductor layer, particularly, a channel of the thin film transistor T and can protect an oxide semiconductor element from external light. The buffer layer BUF can block ions or impurities diffused from the first substrate SUB1 and also block moisture penetration from the outside.

The thin film transistor T includes a semiconductor layer ACT, a gate electrode GE, a source electrode SE, and a drain electrode DE.

A gate insulating layer GI and the gate electrode GE are disposed on the semiconductor layer ACT. The gate insulating layer GI functions to insulate the gate electrode GE and may be formed of silicon oxide (SiOx). However, embodiments are not limited thereto. The gate electrode GE is disposed to overlap the semiconductor layer ACT with the gate insulating layer GI interposed therebetween. The gate electrode GE may be formed as a single layer or a multilayer using copper (Cu), molybdenum (Mo), aluminum (Al), chrome (Cr), gold (Au), titanium (Ti), nickel (Ni), neodymium (Nd), tantalum (Ta), tungsten (W), or a combination thereof. The gate insulating layer GI and the gate electrode GE may be patterned using the same mask. In this instance, the gate insulating layer GI and the gate electrode GE may have the same area. Although not shown, the gate insulating layer GI may be formed to cover the entire surface of the first substrate SUB1.

An interlayer dielectric layer IN is positioned on the gate electrode GE. The interlayer dielectric layer IN functions to insulate the gate electrode GE and the source and drain electrodes SE and DE from each other. The interlayer dielectric layer IN may be formed of silicon oxide (SiOx), silicon nitride (SiNx), or a multilayer thereof. However, embodiments are not limited thereto.

The source electrode SE and the drain electrode DE are positioned on the interlayer dielectric layer IN. The source electrode SE and the drain electrode DE are spaced from each other by a predetermined distance. The source electrode SE contacts one side of the semiconductor layer ACT through a source contact hole penetrating the interlayer dielectric layer IN. The drain electrode DE contacts the other side of the semiconductor layer ACT through a drain contact hole penetrating the interlayer dielectric layer IN.

Each of the source electrode SE and the drain electrode DE may be formed as a single layer or as a multilayer. When each of the source electrode SE and the drain electrode DE is formed as the single layer, each of the source electrode SE and the drain electrode DE may be formed of molybdenum (Mo), aluminum (Al), chrome (Cr), gold (Au), titanium (Ti), nickel (Ni), neodymium (Nd), copper (Cu), or a combination thereof. When each of the source electrode SE and the drain electrode DE is formed as the multilayer, each of the source electrode SE and the drain electrode DE may be formed as a double layer of Mo/Al—Nd, Mo/Al, Ti/Al or Cu/MoTi, or as a triple layer of Mo/Al—Nd/Mo, Mo/Al/Mo, Ti/Al/Ti or MoTi/Cu/MoTi.

A passivation layer PAS is positioned on the thin film transistor T. The passivation layer PAS protects the thin film transistor T and may be formed of silicon oxide (SiOx), silicon nitride (SiNx), or a multilayer thereof.

A planarization layer OC is positioned on the passivation layer PAS. The planarization layer OC can reduce or planarize a height difference (or step coverage) of an underlying structure and may be formed of an organic material such as photo acryl, polyimide, benzocyclobutene-based resin, and acrylate-based resin. If necessary or desired, one of the passivation layer PAS and the planarization layer OC may be omitted.

The organic light emitting diode OLE is positioned on the planarization layer OC. The organic light emitting diode OLE includes an anode ANO, an organic compound layer OL, and a cathode CAT.

More specifically, the anode ANO is positioned on the planarization layer OC. The anode ANO may be divided corresponding to each pixel, and one anode ANO may be assigned to each pixel. The anode ANO is connected to the source electrode SE of the thin film transistor T through a contact hole penetrating the passivation layer PAS and the planarization layer OC. The anode ANO may include a reflective layer and thus serve as a reflective electrode. The reflective layer may be formed of aluminum (Al), copper (Cu), silver (Ag), nickel (Ni), molybdenum (Mo), titanium (Ti), palladium (Pd), or a combination thereof. For example, the reflective layer may be formed of Ag/Pd/Cu (APC) alloy. The anode ANO may be formed as a multilayer including a reflective layer. For example, the anode ANO may be formed of a triple layer including ITO/APC/ITO.

A bank layer BN is positioned on the first substrate SUB1, on which the anode ANO is formed, and partitions pixels. The bank layer BN may be formed of an organic material such as polyimide, benzocyclobutene-based resin, and acrylate. A center portion of the anode ANO exposed by the bank layer BN may be defined as an emission region.

The bank layer BN includes an opening exposing at least a portion of the anode ANO. The bank layer BN may be configured to expose most of the center portion of the anode ANO and cover an edge of the anode ANO. The exposed portion of the anode ANO may be designed to have as large an area as possible, in order to sufficiently secure an aperture ratio.

The bank layer BN and the planarization layer OC may be patterned to cover only the thin film transistor T and a storage capacitor Cst connected to the thin film transistor T inside the pixel. As shown in FIG. 3, the storage capacitor Cst may have a triple structure in which first to third capacitor electrodes are stacked. However, embodiments are not limited thereto. For example, the storage capacitor Cst may be implemented as a plurality of layers.

A spacer SP is positioned on the bank layer BN. The spacer SP may include a plurality of spacers SP, and the plurality of spacers SP may be selectively disposed at a predetermined location on the bank layer BN. The spacer SP has a shape protruding toward the second substrate SUB2. The bank layer BN and the spacer SP may be simultaneously formed through one mask process using a half-tone mask. However, embodiments are not limited thereto.

The organic compound layer OL is positioned on the first substrate SUB1 on which the bank layer BN and the spacer SP are formed. The organic compound layer OL is widely formed on a entire surface of the first substrate SUB1 to cover the bank layer BN and the spacer SP. The organic compound layer OL is a layer, in which electrons and holes combine under and emit light. The organic compound layer OL includes an emission layer EML and may further include one or more of a hole injection layer HIL, a hole transport layer HTL, an electron transport layer ETL, and an electron injection layer EIL. The emission layer EML may include a light emitting material that generates white light.

The organic compound layer OL emitting white light may have a multi-stack structure, for example, an n-stack structure, where n is an integer equal to or greater than 1. For example, 2-stack structure may include a charge generation layer CGL between the anode ANO and the cathode CAT and a first stack and a second stack respectively disposed on and under the charge generation layer CGL. Each of the first stack and the second stack includes an emission layer and may further include at least one common layer. The emission layer of the first stack and the emission layer of the second stack may include light emitting materials of different colors, respectively.

The cathode CAT is positioned on the organic compound layer OL. The cathode CAT is widely formed on the entire surface of the first substrate SUB1 to cover the organic compound layer OL. The cathode CAT may be formed of a transparent conductive material such as indium tin oxide (ITO) and indium zinc oxide (IZO). Alternatively, the cathode CAT may be formed of a material, which is thin enough to transmit light, for example, magnesium (Mg), calcium (Ca), aluminum (Al), silver (Ag), or a combination thereof.

An inorganic layer IOF is positioned on the cathode CAT. The inorganic layer IOF may be widely formed on the entire surface of the first substrate SUB1. The inorganic layer IOF may be formed of an inorganic material such as silicon oxide (SiOx), silicon nitride (SiNx), silicon oxynitride (SiON), aluminum oxide ($Al_2O_3$), and titanium dioxide ($TiO_2$).

The inorganic layer IOF is positioned on the cathode CAT and can block the penetration of foreign material that may enter the organic light emitting diode OLE. For example, because the cathode CAT including a transparent conductive material is a crystalline component and cannot block the penetration of ions and moisture, an ion component of an ionic liquid included in the conductive filler layer CFL or external impurities may pass through the cathode CAT and may enter the organic compound layer OL. The embodiment of the disclosure further includes the inorganic layer IOF shielding most of the organic light emitting diode OLE and can efficiently block the penetration of foreign material that may enter the organic light emitting diode OLE. Hence, the embodiment of the disclosure can prevent a reduction in lifespan of the organic light emitting diode OLE and a luminance reduction.

In addition, the inorganic layer IOF is positioned on the cathode CAT and can buffer or mitigate a stress applied to the cathode CAT when the first substrate SUB1 and the second substrate SUB2 are attached to each other. For example, because the cathode CAT including the transparent conductive material has brittle characteristics, the cathode CAT may easily crack due to an external force applied. The embodiment of the disclosure further includes the inorganic layer IOF on the cathode CAT and can prevent a crack from being generated in the cathode CAT. Furthermore, the embodiment of the disclosure can prevent the penetration of oxygen or moisture through the crack.

The inorganic layer IOF includes a first open hole OP1. The first open hole OP1 exposes at least a portion of the cathode CAT positioned on the spacer SP. Namely, the inorganic layer IOF covers the cathode CAT, but exposes a portion of the cathode CAT in a formation area of the spacer SP through the first open hole OP1. The first open hole OP1 is provided corresponding to the formation area of the spacer SP. A planar shape of the first open hole OP1 may correspond to a planar shape of the spacer SP.

An organic layer OF is positioned on the inorganic layer IOF. The organic layer OF may be widely formed on the entire surface of the first substrate SUB1. The organic layer OF may be formed of an organic material such as an olefin-based polymer, polyethylene terephthalate (PET), an epoxy resin, a fluorine resin, an acryl resin, polysiloxane, and novolac.

The organic layer OF includes a second open hole OP2. The second open hole OP2 exposes at least a portion of the cathode CAT positioned on the spacer SP. Namely, the inorganic layer IOF covers the cathode CAT and the inorganic layer IOF, but exposes the first open hole OP1 of the inorganic layer IOF and a portion of the cathode CAT in a formation area of the spacer SP through the second open hole OP2. The second open hole OP2 may further expose at least a portion of the inorganic layer IOF.

The second open hole OP2 is provided corresponding to the formation area of the spacer SP. Further, the second open hole OP2 is provided corresponding to a formation area of the first open hole OP1. A planar shape of the second open hole OP2 may correspond to the planar shape of the spacer SP and the planar shape of the first open hole OP1.

A portion of the cathode CAT exposed by the first open hole OP1 and the second open hole OP2 directly contacts the conductive filler layer CFL. As will be described later, the exposed portion of the cathode CAT is electrically connected to the Evss line EVL of the second substrate SUB2 through the conductive filler layer CFL.

The Evss line EVL and a color filter CF are formed on the second substrate SUB2. A stacking order of the Evss line EVL and the color filter CF on the second substrate SUB2 may be changed. For example, the color filter CF may be formed after the Evss line EVL is formed, or the Evss line EVL may be formed after the color filter CF is formed.

The Evss line EVL includes a low resistance conductive material. For example, the Evss line EVL may be formed of molybdenum (Mo), aluminum (Al), chromium (Cr), gold (Au), titanium (Ti), nickel (Ni), neodymium (Nd), copper (Cu), or a combination thereof.

The Evss line EVL may include a low reflective conductive material. For example, the Evss line EVL is formed of the low reflective conductive material and thus can prevent visibility from being reduced by the reflection of external light. Thus, a display device according to embodiments of the disclosure does not need to include a separate component for shielding (or absorbing) light incident from outside, like a polarizing film.

The Evss line EVL may function as a black matrix. Therefore, the Evss line EVL can prevent a defect of color mixture from occurring between neighboring pixels. The Evss line EVL is disposed corresponding to a non-emission region so as to expose at least the emission region. Further, the embodiment of the disclosure can use the Evss line EVL as the black matrix and thus does not need to additionally perform a separate process for forming the black matrix. Therefore, the embodiment of the disclosure can further reduce the number of processes compared to a related art structure, and thus can reduce the manufacturing time and the manufacturing cost and remarkably improve product yield.

The color filter CF may include red (R), blue (B), and green (G) color filters. The pixel may include subpixels emitting red, blue, and green light, and the color filters CF may be respectively assigned to the corresponding subpixels. The red, blue, and green color filters CF may be partitioned by the Evss line EVL.

The OLED display according to the embodiment of the invention can represent red, green, and blue colors by allowing white light emitted from the organic compound layer OL to pass through the red, green, and blue color filters CF respectively included in regions corresponding to red, green, and blue pixels PXL. If necessary or desired, the pixel may further include a white (W) subpixel.

The conductive filler layer CFL is interposed between the first substrate SUB1 and the second substrate SUB2 and includes a conductive medium. The conductive filler layer CFL may be configured such that conductive fillers are dispersed in a solvent. Alternatively, the conductive filler layer CFL may include a conductive solvent. For example, the conductive filler layer CFL may include at least one of poly(3,4-ethylenedioxythiophene) (PEDOT) which is a conductive polymer, and an ionic liquid. However, embodiments are not limited thereto.

The attachment distance between the first substrate SUB1 and the second substrate SUB2 may be appropriately selected depending on viscosity of the conductive filler layer CFL. Because the embodiment of the disclosure uses conductive fillers having lower viscosity than non-conductive fillers, the attachment distance between the first substrate SUB1 and the second substrate SUB2 can be reduced. Hence, the embodiment of the disclosure can secure a wide viewing angle and a high aperture ratio.

The exposed portion of the cathode CAT of the first substrate SUB1 and the Evss line EVL of the second substrate SUB2 are electrically connected through the conductive filler layer CFL. Thus, the low potential power voltage is applied to both the cathode CAT and the Evss line EVL. Hence, the cathode CAT, the conductive filler layer CFL, and the Evss line EVL of the low resistance can form a power supply path through which the low potential power voltage is applied.

The embodiment of the disclosure can reduce a voltage variation (or voltage deviation) depending on a position by connecting the Evss line EVL formed of the low resistance conductive material to the cathode CAT, thereby minimizing non-uniformity of luminance.

The embodiment of the disclosure does not need to separately assign an area for forming the Evss line EVL and an area for connecting the Evss line EVL and the cathode CAT to the thin film transistor array substrate, as in the related art. Because the embodiment of the disclosure does not need to separately assign the area for forming the Evss line EVL and the area for connecting the Evss line EVL and the cathode CAT to the thin film transistor array substrate as described above, the embodiment of the disclosure can sufficiently secure an aperture ratio as much as the corresponding areas. Further, because the embodiment of the disclosure does not need to perform an additional process for forming an addition structure such as a barrier as in the related art, the embodiment of the disclosure can reduce process time and process cost and can greatly improve process yield. Thus, the embodiment of the disclosure can be easily applied to a high-resolution display having a high pixel per inch (PPI) and can remarkably improve a degree of design freedom.

Figure 5A:
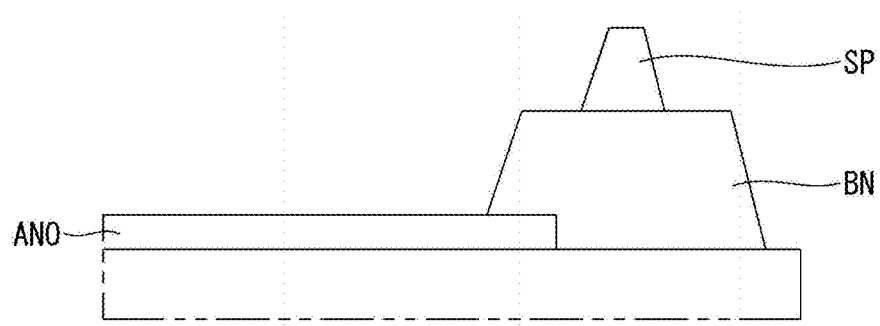
FIGS. 5A to 5C illustrate a method of manufacturing an OLED display according to an embodiment of the disclosure.
Figure 5B:
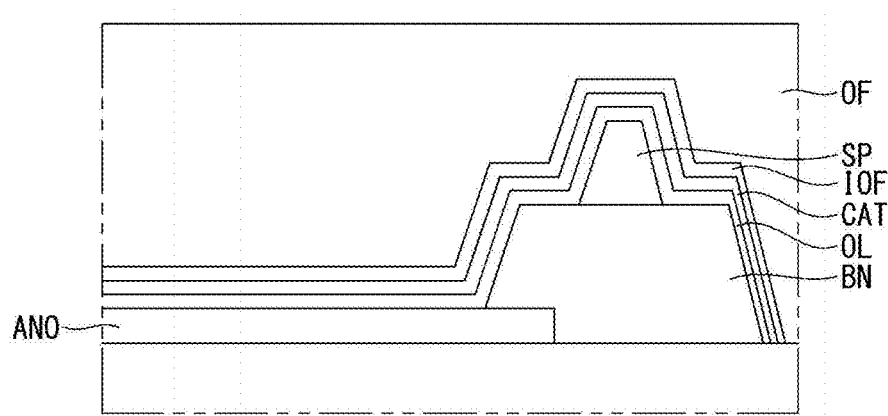
Figure 5C:
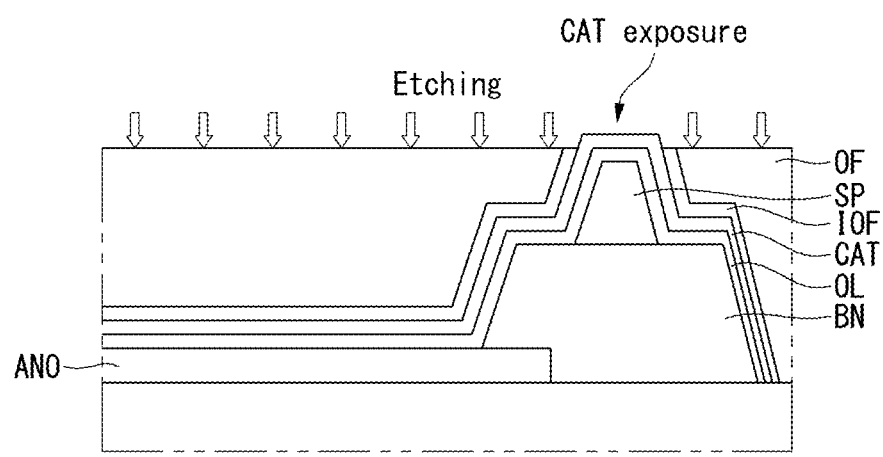

FIGS. 5A to 5C illustrate a method of manufacturing an OLED display according to an embodiment of the disclosure. With reference to FIGS. 5A to 5C, only a process for exposing a portion of a cathode, which is a feature of an embodiment of the disclosure, is described in detail below.

Referring to FIG. 5A, the bank layer BN and the spacer SP are formed on the first substrate on which the anode ANO is formed. The bank layer BN and the spacer SP may be sequentially formed through different processes, or may be simultaneously formed through one mask process using a half-tone mask. The spacer SP may be provided on the bank layer BN to form one body and may have the same planar shape as the bank layer BN. Alternatively, the spacer SP may be provided on the bank layer BN as a plurality of spacers, and the plurality of spacers may be selectively disposed at a predetermined location on the bank layer BN.

Referring to FIG. 5B, the organic compound layer OL, the cathode CAT, the inorganic layer IOF, and the organic layer OF are sequentially formed on the first substrate on which the bank layer BN and the spacer SP are formed. Because the organic layer OF can compensate for a height difference (or a stepped portion) of structures formed under the organic layer OF due to its material characteristics, an upper surface of the organic layer OF is planarized.

Referring to FIG. 5C, an etching process is performed to expose at least a portion of the cathode CAT. The etching process removes a partial thickness of the organic layer OF and also removes the inorganic layer IOF exposed by removing the partial thickness of the organic layer OF. Namely, as a thickness of the organic layer OF is uniformly removed throughout the entire area through the etching process. Here, a portion of the inorganic layer IOF that relatively more protrudes than other area by the spacer SP is exposed. The etching process is subsequently performed to remove together the organic layer OF and the exposed portion of the inorganic layer IOF. Hence, only a portion of the cathode CAT relatively more protruding than other area by the spacer SP is exposed. As described above, because the etching process is performed until a portion of the cathode CAT on the spacer SP is exposed, only a portion of the cathode CAT on the spacer SP is not covered by the inorganic layer IOF and the organic layer OF and is exposed. In other words, the cathode CAT disposed outside an area, in which the spacer SP is formed, is not exposed.

After the etching process, the upper surface of the organic layer OF may be positioned on the same plane as an exposed upper surface of the cathode CAT, or may be positioned under the exposed upper surface of the cathode CAT. After the etching process, an upper surface of the inorganic layer IOF may be positioned on the same plane as the exposed upper surface of the cathode CAT, or may be positioned under the exposed upper surface of the cathode CAT. After the etching process, the upper surface of the organic layer OF may be positioned on the same plane as the exposed upper surface of the inorganic layer IOF.

An area of the inorganic layer IOF removed to expose the cathode CAT may be referred to as the first open hole OP1, and an area of the organic layer OF removed to expose the cathode CAT may be referred to as the second open hole OP2. An etchant used in the etching process may be selected as a material that does not damage a material forming the cathode CAT while removing the organic layer OF and the inorganic layer IOF.

A portion of the cathode CAT, that is exposed to the outside through the above-described process, may directly contact the conductive filler layer CFL (see FIG. 3) and may be electrically connected to the Evss line EVL (see FIG. 3) formed on the second substrate SUB2 (see FIG. 3) through the conductive filler layer CFL (see FIG. 3).

Hereinafter, examples of a power supply path of a low potential power voltage generated from a power generating part (not shown) are described in detail.

First Embodiment

Figure 6:
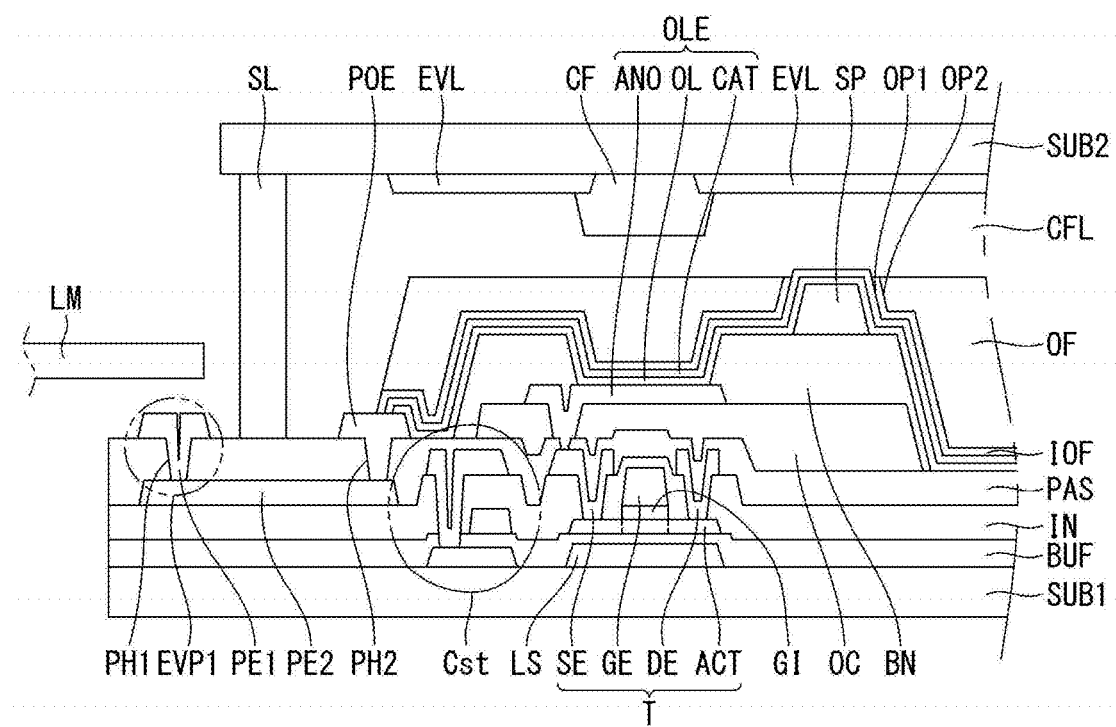
FIG. 6 illustrates an example of a power supply path of a low potential power voltage generated from a power generating part in an OLED display according to a first embodiment of the disclosure.

FIG. 6 illustrates an example of a power supply path of a low potential power voltage generated from a power generating part in an OLED display according to a first embodiment of the disclosure.

Referring to FIG. 6, the OLED display according to the first embodiment of the disclosure further includes a connection member LM attached to at least one side of a first substrate SUB1. The connection member LM may be a chip-on film (COF). However, embodiments are not limited thereto.

The first substrate SUB1 includes a low potential power voltage pad (hereinafter referred to as "Evss pad") EVP1 and a power electrode POE. The Evss pad EVP1 is disposed outside a sealant SL and is electrically connected to the connection member LM. The power electrode POE is disposed inside the sealant SL and is electrically connected to a conductive filler layer CFL.

The Evss pad EVP1 receives a low potential power voltage generated from a power generating part (not shown) through the connection member LM and transfers the received low potential power voltage to the power electrode POE. The power electrode POE then transfers the low potential power voltage to the conductive filler layer CFL and a cathode CAT.

More specifically, the Evss pad EVP1 includes at least one pad electrode. When a plurality of pad electrodes is used, the pad electrodes may be disposed at different layers with at least one insulating layer interposed therebetween and may be electrically connected through a pad contact hole penetrating the at least one insulating layer. For example, as shown in FIG. 6, the Evss pad EVP1 may include a first pad electrode PE1 and a second pad electrode PE2 that are disposed at different layers with a passivation layer PAS interposed therebetween, and the first pad electrode PE1 and the second pad electrode PE2 may be connected to each other through a first pad contact hole PH1 penetrating the passivation layer PAS. Hereinafter, the embodiment of the disclosure describes a case where the Evss pad EVP1 includes the first pad electrode PE1 and the second pad electrode PE2 as an example, for convenience of explanation.

The first pad electrode PE1 is disposed outside the sealant SL and is exposed to the outside. The exposed first pad electrode PE1 may be attached to the connection member LM. The first pad electrode PE1 and the connection member LM may be attached to each other through an anisotropic conductive film (ACF) layer (not shown) interposed between them.

The second pad electrode PE2 is extended to the inside of the sealant SL and is electrically connected to the power electrode POE. In this instance, the second pad electrode PE2 may contact the power electrode POE through a second pad contact hole PH2 penetrating the passivation layer PAS. FIG. 6 illustrates that the second pad electrode PE2 and the power electrode POE are disposed with only the passivation layer PAS interposed therebetween, by way of example. However, embodiments are not limited thereto. For example, the second pad electrode PE2 and the power electrode POE may be disposed at different layers with the passivation layer PAS and a planarization layer OC interposed therebetween and may be electrically connected to each other through a contact hole penetrating the passivation layer PAS and the planarization layer OC.

The power electrode POE may be formed together when an anode ANO is formed. Namely, the power electrode POE may be formed of the same material as the anode ANO. However, embodiments are not limited thereto.

At least a portion of the power electrode POE may be exposed and may directly contact the conductive filler layer CFL. In order to expose at least a portion of the power electrode POE, respective areas of layers widely formed on an entire surface of the first substrate SUB1 may be controlled. The layers, of which the area is controllable, may be layers e.g., an organic compound layer OL, the cathode CAT, an inorganic layer IOF, and an organic layer OF) formed after the formation of the power electrode POE.

More specifically, the above layers are formed using a frame-shaped open mask (not shown) having an opening. An area of the opening of the open mask may correspond to an area occupied by the above layers on the first substrate SUB1. Thus, at least a portion of the power electrode POE can be exposed by controlling the area of the opening of the open mask. The exposed portion of the power electrode POE may directly contact the conductive filler layer CFL and supply the low potential power voltage to the conductive filler layer CFL. Hence, a power supply path connecting the connection member LM, the Evss pad EVP1, and the conductive filler layer CFL may be formed. Through the power supply path, the low potential power voltage can be supplied to an Evss line EVL of a second substrate SUB2 and can be supplied to the cathode CAT of the first substrate SUB1.

The cathode CAT on the power electrode POE may cover the organic compound layer OL, and one end of the cathode CAT may protrude more than the organic compound layer OL and directly contact the power electrode POE. Namely, one end of the cathode CAT may directly contact an exposed upper surface of the power electrode POE. Hence, a power supply path connecting the connection member LM, the Evss pad EVP1, and the cathode CAT may be formed.

The first embodiment of the disclosure can form a low potential power supply path by electrically connecting the connection member LM, the Evss pad EVP1, the power electrode POE, the conductive filler layer CFL, and the cathode CAT and can also form a low potential power supply path by electrically connecting the connection member LM, the Evss pad EVP1, the power electrode POE, the conductive filler layer CFL, the Evss line EVL, and the cathode CAT.

The first embodiment of the disclosure can form a plurality of power supply paths for supplying the low potential power voltage to the Evss line EVL of the second substrate SUB2. The first embodiment of the disclosure can easily supply the low potential power voltage to the Evss line EVL of the second substrate SUB2 by sufficiently securing the power supply paths.

Second Embodiment

Figure 7:
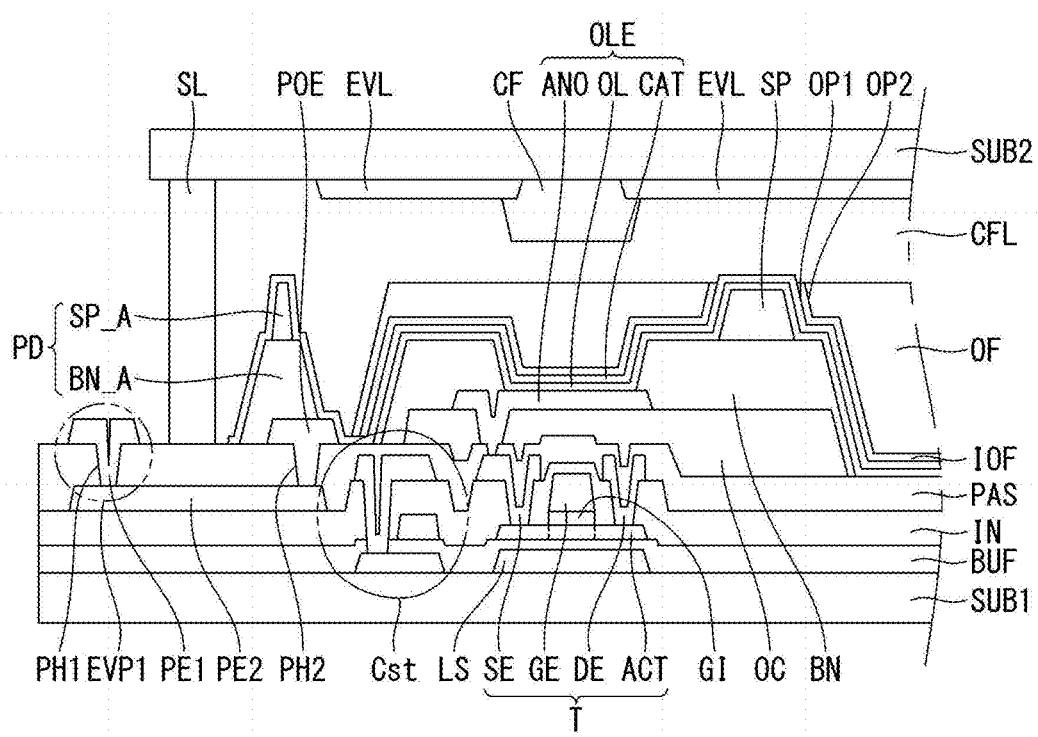
FIG. 7 illustrates an example of a power supply path of a low potential power voltage generated from a power generating part in an OLED display according to a second embodiment of the disclosure.

FIG. 7 illustrates an example of a power supply path of a low potential power voltage generated from a power generating part in an OLED display according to a second embodiment of the disclosure. Description of structures and components identical or equivalent to those illustrated in the first embodiment is omitted in the second embodiment.

The OLED display according to the second embodiment of the disclosure has a structure in which a first substrate SUB1 and a second substrate SUB2 are attached to each other. The first substrate SUB1 and the second substrate SUB2 are spaced from each other by a predetermined attachment distance. As described above, the second embodiment of the disclosure can have a power supply path for supplying a low potential power voltage generated from a power generating part to an Evss line EVL of a second substrate SUB2 through a conductive filler layer CFL, for the smooth power supply.

However, because a power electrode POE of the first substrate SUB1 and the Evss line EVL of the second substrate SUB2 are electrically connected through the conductive filler layer CFL interposed between them, the supply of a power voltage may not be easily performed due to a resistance of the conductive filler layer CFL. Namely, because the resistance of the conductive filler layer CFL increases as a distance between the power electrode POE and the Evss line EVL increases, it may be difficult to perform the supply of the power voltage. A method may be considered to reduce a distance between the first substrate SUB1 and the second substrate SUB2 in consideration of the resistance. However, because the attachment distance between the first substrate SUB1 and the second substrate SUB2 needs to be fixed to a previously set distance in consideration of characteristics of display devices, there is a limit to adjusting the attachment distance. In order to prevent the above-described problem, the OLED display according to the second embodiment of the disclosure includes a protruding pattern PD.

Referring to FIG. 7, the protruding pattern PD may be disposed adjacent to the power electrode POE on the first substrate SUB1. FIG. 7 illustrates that at least a portion of the protruding pattern PD overlaps the power electrode POE, by way of example. However, embodiments are not limited thereto. The protruding pattern PD has a shape protruding toward the second substrate SUB2. An upper surface of the protruding pattern PD may be disposed adjacent to the Evss line EVL.

The protruding pattern PD may be formed together when at least one of insulating layers constituting the OLED display is formed. For example, the protruding pattern PD may be configured as a single layer including a bank layer formation material BN_A constituting the bank layer BN or a spacer formation material SP_A constituting the spacer SP. As another example, as shown in FIG. 7, the protruding pattern PD may be configured as a plurality of layers in which the bank layer formation material BN_A and the spacer formation material SP_A are stacked. Because it may be difficult to form the protruding pattern PD at a sufficient height using a single material due to process limitations, the protruding pattern PD may be configured such that a plurality of layers is stacked.

A cathode CAT is extended more than an organic compound layer OL while covering the organic compound layer OL and directly contacts the power electrode POE. The organic compound layer OL may expose at least a portion of the power electrode POE, and the cathode CAT may contact the exposed portion of the power electrode POE.

The cathode CAT is further extended to cover the protruding pattern PD. FIG. 7 illustrates that the cathode CAT completely covers the protruding pattern PD, by way of example. However, embodiments are not limited thereto. For example, it is sufficient that the cathode CAT is extended to cover at least a portion of the protruding pattern PD so that the cathode CAT is disposed adjacent to the Evss line EVL of the second substrate SUB2. The cathode CAT may be extended up to a most protruding portion (e.g., the upper surface) of the protruding pattern PD.

An inorganic layer IOF and an organic layer OF are formed to expose at least a portion of the cathode CAT disposed on the protruding pattern PD, so that the cathode CAT can directly contact the conductive filler layer CFL. This can be implemented by adjusting an area of an opening of an open mask.

The second embodiment of the disclosure can set a distance between the power electrode POE and the Evss line EVL to as small a distance as possible in the process by including the protruding pattern PD. Hence, the second embodiment of the disclosure can stably supply the power voltage to the Evss line EVL by reducing an influence of the above-described resistance.

Third Embodiment

Figure 8:
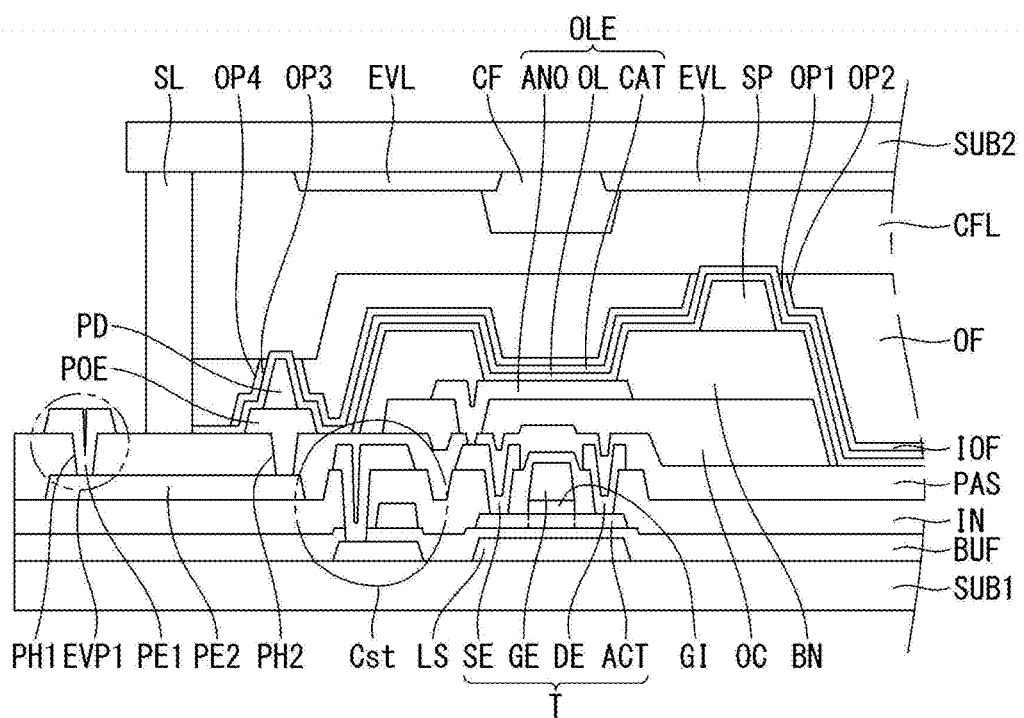
FIGS. 8 and 9 illustrate an example of a power supply path of a low potential power voltage generated from a power generating part in an OLED display according to a third embodiment of the disclosure.
Figure 9:
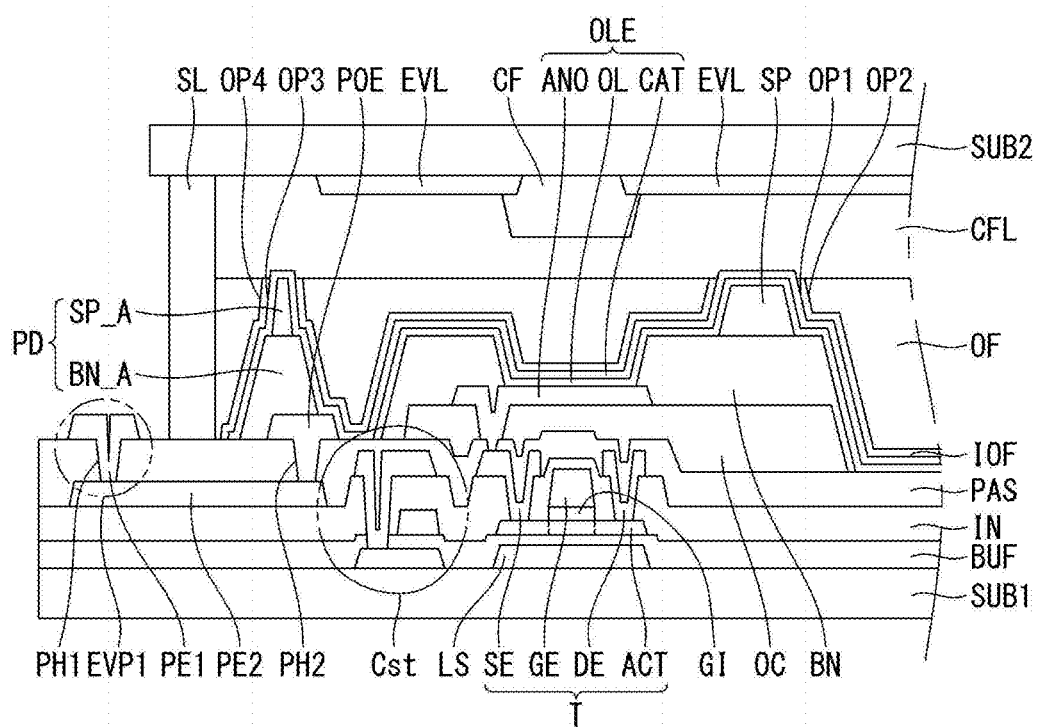

FIGS. 8 and 9 illustrate an example of a power supply path of a low potential power voltage generated from a power generating part in an OLED display according to a third embodiment of the disclosure. Description of structures and components identical or equivalent to those illustrated in the first and second embodiments is omitted in the third embodiment.

Referring to FIGS. 8 and 9, a protruding pattern PD may be disposed adjacent to a power electrode POE on a first substrate SUB1. FIGS. 8 and 9 illustrate that at least a portion of the protruding pattern PD overlaps the power electrode POE, by way of example. However, embodiments are not limited thereto. The protruding pattern PD has a shape protruding toward a second substrate SUB2. An upper surface of the protruding pattern PD may be disposed adjacent to an Evss line EVL.

The protruding pattern PD may be formed together when at least one of insulating layers constituting the OLED display is formed. For example, as shown in FIG. 8, the protruding pattern PD may be configured as a single layer including a bank layer formation material BN_A constituting the bank layer BN or a spacer formation material SP_A constituting the spacer SP. As another example, as shown in FIG. 9, the protruding pattern PD may be configured as a plurality of layers in which a bank layer formation material BN_A and a spacer formation material SP_A are stacked. Because it may be difficult to form the protruding pattern PD at a sufficient height using a single material due to process limitations, the protruding pattern PD may be configured such that a plurality of layers is stacked.

A cathode CAT is extended more than an organic compound layer OL while covering the organic compound layer OL and directly contacts the power electrode POE. The organic compound layer OL may expose at least a portion of the power electrode POE, and the cathode CAT may contact the exposed portion of the power electrode POE.

The cathode CAT is further extended to cover the protruding pattern PD. FIGS. 8 and 9 illustrate that the cathode CAT completely covers the protruding pattern PD, by way of example. However, embodiments are not limited thereto. For example, it is sufficient that the cathode CAT is extended to cover at least a portion of the protruding pattern PD so that the cathode CAT is disposed adjacent to the Evss line EVL of the second substrate SUB2. The cathode CAT may be extended up to a most protruding portion (e.g., the upper surface) of the protruding pattern PD.

An inorganic layer IOF and an organic layer OF are formed to expose at least a portion of the cathode CAT disposed on the protruding pattern PD, so that the cathode CAT can directly contact the conductive filler layer CFL. This can be implemented by performing an etching process for removing a partial thickness of each of the inorganic layer IOF and the organic layer OF as described in the first embodiment. In other words, a portion of the cathode CAT on the protruding pattern PD can be exposed through the etching process. A portion of the inorganic layer IOF, that is penetrated to expose a portion of the cathode CAT, may be referred to as a third open hole OP3, and a portion of the organic layer OF, that is penetrated to expose a portion of the cathode CAT, may be referred to as a fourth open hole OP4. The fourth open hole OP4 may expose the third open hole OP3 and at least a portion of the inorganic layer IOF. The third open hole OP3 exposes at least a portion of the cathode CAT positioned on the protruding pattern PD, and the fourth open hole OP4 exposes at least a portion of the cathode CAT positioned on the protruding pattern PD.

The third embodiment of the disclosure can set a distance between the power electrode POE and the Evss line EVL to as small a distance as possible in the process by including the protruding pattern PD. Hence, the third embodiment of the disclosure can stably supply a power voltage to the Evss line EVL by reducing an influence of resistance described above.

Fourth Embodiment

Figure 10:
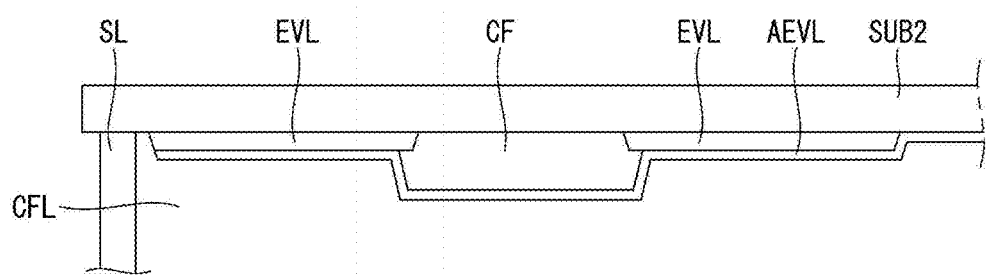
FIG. 10 is a cross-sectional view of an OLED display according to a fourth embodiment of the disclosure.

FIG. 10 is a cross-sectional view of an OLED display according to a fourth embodiment of the disclosure. Description of structures and components identical or equivalent to those illustrated in the first embodiment is omitted in the fourth embodiment.

Referring to FIG. 10, the OLED display according to the fourth embodiment of the disclosure includes a first substrate SUB1 (see FIG. 3) and a second substrate SUB2 facing each other. An Evss line EVL and an auxiliary Evss line (or referred to as "auxiliary power line") AEVL are formed on the second substrate SUB2. A color filter CF may be positioned on the second substrate SUB2 as in the first embodiment and may be positioned on the first substrate SUB1 if necessary or desired.

One surface of the auxiliary Evss line AEVL directly contacts the Evss line EVL, and the other surface of the auxiliary Evss line AEVL directly contacts a conductive filler layer CFL. The auxiliary Evss line AEVL is a power line for increasing a contact area between the Evss line EVL and the conductive filler layer CFL and may have an area larger than the Evss line EVL. The auxiliary Evss line AEVL may be interposed between the Evss line EVL and the conductive filler layer CFL. The auxiliary Evss line AEVL may be formed to cover the Evss line EVL and the color filter CF and may be widely formed on an entire surface of the second substrate SUB2 including an emission region. The auxiliary Evss line AEVL may be formed of a transparent conductive material such as indium tin oxide (ITO) and indium zinc oxide (IZO).

Because the fourth embodiment of the disclosure can sufficiently secure the contact area between the Evss line EVL and the conductive filler layer CFL using the auxiliary Evss line AEVL, the fourth embodiment of the disclosure can minimize a contact failure between the Evss line EVL and the conductive filler layer CFL. Further, the fourth embodiment of the disclosure can more efficiently reduce a voltage variation depending on a position and thus can minimize non-uniformity of luminance.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting diode display, comprising:
a first substrate and a second substrate facing each other; and
a conductive filler layer interposed between the first substrate and the second substrate,
wherein the first substrate includes:
a bank layer having an opening exposing at least a portion of an anode;
a spacer disposed on the bank layer;
an organic compound layer and a cathode disposed on the anode, the bank layer, and the spacer, the organic compound layer and the cathode being sequentially stacked;
an inorganic layer disposed on the cathode, the inorganic layer including a first open hole exposing at least a portion of the cathode positioned on the spacer; and
an organic layer disposed on the inorganic layer, the organic layer including a second open hole exposing at least a portion of the cathode positioned on the spacer, wherein an upper surface of the organic layer is positioned on the same plane as an upper surface of the inorganic layer, wherein the exposed portion of the cathode directly contacts the conductive filler layer;
wherein the second substrate includes a power line electrically connected to a portion of the exposed cathode through the conductive filler layer.

2. The organic light emitting diode display of claim 1, wherein the second open hole exposes at least a portion of the inorganic layer and the first open hole.

3. The organic light emitting diode display of claim 1, wherein a planar shape of the first open hole corresponds to a planar shape of the spacer.

4. The organic light emitting diode display of claim 1, wherein a planar shape of the second open hole corresponds to a planar shape of the spacer.

5. The organic light emitting diode display of claim 1, wherein the upper surface of the organic layer is positioned on the same plane as an upper surface of the exposed cathode, or is positioned below the upper surface of the exposed cathode.

6. The organic light emitting diode display of claim 1, wherein the upper surface of the inorganic layer is positioned on the same plane as an upper surface of the exposed cathode, or is positioned below the upper surface of the exposed cathode.

7. The organic light emitting diode display of claim 1, wherein the first substrate includes a power electrode receiving a power voltage from a power generating part, and wherein the power electrode directly contacts the conductive filler layer.

8. The organic light emitting diode display of claim 1, wherein the first substrate includes a power electrode receiving a power voltage from a power generating part, and
wherein the cathode directly contacts the power electrode.

9. The organic light emitting diode display of claim 8, wherein the first substrate includes a protruding pattern protruding toward the second substrate, and
wherein the cathode is extended to cover at least a portion of the protruding pattern.

10. The organic light emitting diode display of claim 9, wherein at least a portion of the protruding pattern overlaps the power electrode.

11. The organic light emitting diode display of claim 9, wherein the protruding pattern is configured as a single layer including a material constituting the bank layer or a material constituting the spacer, or is configured as a plurality of layers provided by stacking the material constituting the bank layer and the material constituting the spacer.

12. The organic light emitting diode display of claim 9, wherein the inorganic layer includes a third open hole exposing at least a portion of the cathode positioned on the protruding pattern, and
wherein the organic layer includes a fourth open hole exposing at least a portion of the cathode positioned on the protruding pattern.

13. The organic light emitting diode display of claim 12, wherein the fourth open hole exposes at least a portion of the inorganic layer and the third open hole.

14. The organic light emitting diode display of claim 1, wherein the second substrate further includes color filters, and
wherein the color filters are partitioned by the power line.

15. The organic light emitting diode display of claim 1, wherein each of the first substrate and the second substrate includes an emission region, to which light from an organic light emitting diode is emitted, and a non-emission region outside the emission region, and
wherein the power line is disposed in the non-emission region.

16. The organic light emitting diode display of claim 1, wherein the second substrate further includes an auxiliary power line, of which one surface directly contacts the power line and another surface opposite the one surface directly contacts the conductive filler layer, and
wherein the auxiliary power line has an area larger than the power line.

* * * * *